(12) United States Patent
Wang et al.

(10) Patent No.: US 9,532,471 B2
(45) Date of Patent: Dec. 27, 2016

(54) PERPENDICULAR AND ORTHOGONAL INTERCONNECTION SYSTEM AND COMMUNICATIONS DEVICE

(71) Applicant: Huawei Technologies Co., Ltd., Shenzhen (CN)

(72) Inventors: Baoqi Wang, Shenzhen (CN); Guodong Zhang, Shenzhen (CN); Fangming Liu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 171 days.

(21) Appl. No.: 14/531,521

(22) Filed: Nov. 3, 2014

(65) Prior Publication Data

US 2015/0049451 A1 Feb. 19, 2015

Related U.S. Application Data

(63) Continuation of application No. PCT/CN2012/083542, filed on Oct. 26, 2012.

(30) Foreign Application Priority Data

May 4, 2012 (CN) .......................... 2012 1 0136706

(51) Int. Cl.
*H05K 5/00* (2006.01)
*H05K 1/14* (2006.01)
(Continued)

(52) U.S. Cl.
CPC .............. *H05K 5/0065* (2013.01); *H04Q 1/15* (2013.01); *H05K 1/14* (2013.01); *H05K 3/366* (2013.01);
(Continued)

(58) Field of Classification Search
CPC ............ H04Q 1/15; H05K 1/14; H05K 3/366; H05K 5/0065; H05K 7/1445; H01R 23/725; H01R 12/737; H01R 29/00
See application file for complete search history.

(56) References Cited

U.S. PATENT DOCUMENTS 5,971,785 A * 10/1999 Comerci ................ H01R 23/27
439/284
6,528,737 B1 3/2003 Kwong et al.
(Continued)

FOREIGN PATENT DOCUMENTS

CN 2264983 Y 10/1997
CN 2697850 Y 5/2005
(Continued)

*Primary Examiner* — Timothy Thompson
*Assistant Examiner* — Ahmad D Barnes
(74) *Attorney, Agent, or Firm* — Slater Matsil, LLP (57) ABSTRACT

An interconnection system includes a first board group, a second board group orthogonal to the first board group, and a center backplane arranged between the first board group and the second board group. The first board group includes a number of first boards parallel to each other and the second board group includes a number of second boards parallel to each other. Curved male connectors re arranged on each of the first boards and curved female connectors are arranged on each of the second boards. The curved male connectors and the curved female connectors directly cooperate and are connected in one-to-one correspondence.

14 Claims, 5 Drawing Sheets

(51) Int. Cl.
*H05K 3/36* (2006.01)
*H04Q 1/02* (2006.01)
*H05K 7/14* (2006.01)

(52) U.S. Cl.
CPC ....... *H05K 7/1445* (2013.01); *H05K 2201/044* (2013.01); *H05K 2201/10189* (2013.01)

(56) References Cited

U.S. PATENT DOCUMENTS

| | | |
|---|---|---|
| 7,050,307 B2 | 5/2006 | Doblar et al. |
| 7,108,556 B2 * | 9/2006 | Cohen .................. H01R 23/688 361/788 |
| 7,988,456 B2 | 8/2011 | Davis et al. |
| 2002/0046878 A1 * | 4/2002 | Uzuka ..................... H05K 1/14 174/250 |
| 2004/0088597 A1 | 5/2004 | Wu |
| 2005/0064733 A1 | 3/2005 | Korsunsky et al. |
| 2006/0024984 A1 | 2/2006 | Cohen et al. |
| 2006/0228912 A1 | 10/2006 | Morlion et al. |
| 2007/0184676 A1 | 8/2007 | Minich |
| 2008/0166090 A1 | 7/2008 | Kiani et al. |
| 2010/0315771 A1 | 12/2010 | Wu et al. |

FOREIGN PATENT DOCUMENTS

| | | |
|---|---|---|
| CN | 2819710 Y | 9/2006 |
| CN | 101120491 A | 2/2008 |
| CN | 101589516 A | 11/2009 |
| CN | 102695393 A | 9/2012 |

\* cited by examiner

FIG. 1

PRIOR ART

PERPENDICULAR AND ORTHOGONAL INTERCONNECTION SYSTEM AND COMMUNICATIONS DEVICE

This application is a continuation of International Application No. PCT/CN2012/083542, filed on Oct. 26, 2012, which claims priority to Chinese Patent Application No. 201210136706.1, filed on May 4, 2012, both of which are hereby incorporated by reference in their entireties.

TECHNICAL FIELD

The present invention relates to the field of communications technologies, and in particular, to a perpendicular and orthogonal interconnection system and a communications device.

BACKGROUND

In modern electronic communications products, a backplane is generally used to connect electrical signal boards and the like, that is, the backplane needs to provide a signal transmission path and carry a current to be provided for other boards. The backplane and the boards together constitute a perpendicular and orthogonal interconnection system, and refer to the patent document No. ZL200520106997.5 of Huawei Technologies Co., Ltd. for a specific structure of the system. However, with the rapid development of the communications industry, the system capacity and the number of slots increasingly grow, resulting in a dramatic increase of the size of the backplane. Therefore, a link length from a transmit end to a receive end in a system keeps on increasing. However, loss of a transmission link increases with the increase of the link length; particularly for a signal rate of 10 Gbps or above, because of problems with a PCB material, a transmission line, and design and manufacturing, a link length that a chip can support is shorter. Currently, while searching for a new type of high-performance board material and ways to improve chip capability, system engineers are eagerly searching for a solution to shorten the length of a transmission link in a system.

The prior art related to an orthogonal backplane includes two types. Conventional orthogonal connectors are used, including two curved female connectors and two straight male connectors, where the two straight male connectors are separately installed on two sides of a center backplane and share a same via hole; the two curved female connectors are separately installed on two boards, and the two boards are separately located on two sides of the backplane and cooperate with the corresponding straight male connectors, so as to implement interconnection.

Improved orthogonal connectors are used, including two curved female connectors and a straight male connector with pins on two sides, where a via hole is opened at an orthogonal position of a center backplane, and the straight male connector is fastened on the backplane by using a fastening apparatus on a shell; the two curved female connectors are separately installed on two boards, and the two boards are separately located on two sides of the backplane and cooperate with the pins of the straight male connector, so as to implement interconnection. A backplane still needs to provide a common via hole for the conventional orthogonal backplane connectors, and front and rear board insertion directions are perpendicular; therefore, heat dissipation becomes a bottleneck. The via hole opened on the backplane in the improved orthogonal solution facilitates heat dissipation; however, two interfaces where the straight male connector and the curved female connectors cooperate with each other still exist, and therefore, there is still room to shorten the link length. With the development of communications technologies, an existing orthogonal architecture needs to be upgraded. However, currently, it is difficult to upgrade the existing orthogonal architecture, and upgrade costs are high.

SUMMARY

Embodiments of the present invention provide a perpendicular and orthogonal interconnection system, so as to solve the problem of difficulty in upgrading an existing orthogonal architecture.

The embodiments of the present invention are implemented as follows. A perpendicular and orthogonal interconnection system includes a first board group, a second board group orthogonal to the first board group, and a center backplane arranged between the first board group and the second board group, where the first board group includes a plurality of first boards parallel to each other, and the second board group includes a plurality of second boards parallel to each other; a plurality of curved male connectors is arranged on each of the first boards, a plurality of curved female connectors is arranged on each of the second boards, and the curved male connectors and the curved female connectors directly cooperate and are connected in one-to-one correspondence.

Another objective of the embodiments of the present invention is to provide a communications device, where the communications device uses the perpendicular and orthogonal interconnection system.

In the embodiments of the present invention, the curved male connectors and the curved female connectors directly cooperate and are connected. When the perpendicular and orthogonal interconnection system is upgraded, only the board that permanently has the curved male connectors and the curved female connectors needs to be replaced, which is rather simple and shortens a signal link. Based on the foregoing advantages, the perpendicular and orthogonal interconnection system is applicable to various communications devices; therefore, its upgrade is convenient, signal quality is improved, heat dissipation is ideal, and material costs are saved.

BRIEF DESCRIPTION OF THE DRAWINGS

To describe the technical solutions in the embodiments of the present invention more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

FIG. 3 is a schematic structural diagram after FIG. 2 is simplified;

DETAILED DESCRIPTION OF ILLUSTRATIVE EMBODIMENTS

In order to make the objectives, technical solutions, and advantages of the present invention more comprehensible, the present invention is described in further detail below with reference to the accompanying drawings and embodiments. It should be understood that, the specific embodiments described herein are merely used to explain the present invention, but not intended to limit the present invention.

Figure 1:
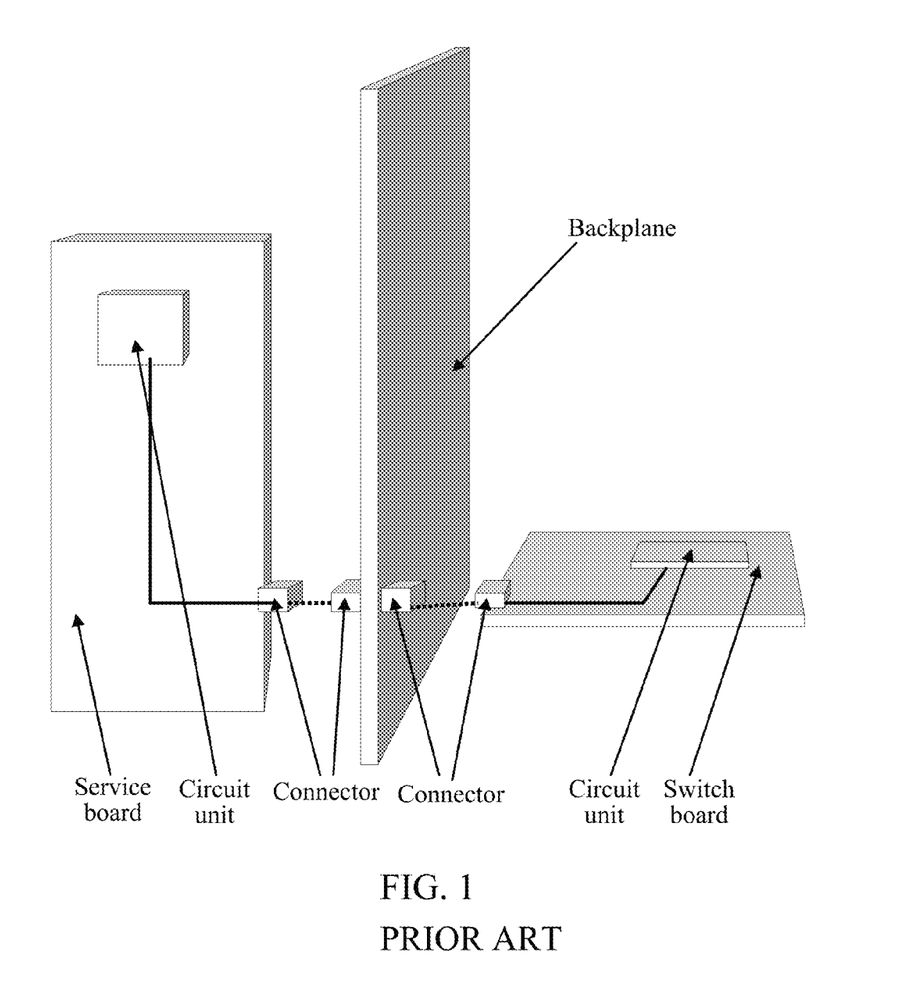
FIG. 1 is a schematic structural diagram of a perpendicular and orthogonal interconnection system in the prior art (a conventional connection manner)

Exemplarily, the embodiments of the present invention provide a schematic structural diagram of a perpendicular and orthogonal interconnection system in the prior art. As shown in FIG. 1, a communications device includes three main components: a service board, a backplane, and a switch board, where signal communication between the service board and the switch board is implemented by using the backplane. The service board may be a first board in Embodiment 1, Embodiment 2, and Embodiment 3; and the switch board may be a second board in Embodiment 1, Embodiment 2, and Embodiment 3. It should be noted that the service board may also be the second board in Embodiment 1, Embodiment 2, and Embodiment 3; and the switch board may also be the first board in Embodiment 1, Embodiment 2, and Embodiment 3, which is not limited herein.

The service board and the switch board are each arranged with a circuit unit, the circuit unit arranged on the service board and the circuit unit arranged on the switch board are connected by using signal connectors (in this diagram, curved male and curved female connectors are not distinguished, and are all referred to as signal connectors), and density of physical interfaces of the signal connectors determines access capacity of the service board. The switch board and the backplane are connected by using signal connectors, and density of physical interfaces of the signal connectors determines access capacity of the switch board. This schematic diagram is only exemplary, and does not show structures, such as a main cabinet and guide rails installed in the main cabinet.

In the embodiments of the present invention, the curved male connectors and the curved female connectors directly cooperate and are connected. When the perpendicular and orthogonal interconnection system is upgraded, only the board that permanently has the curved male connectors and the curved female connectors needs to be replaced, which is rather simple and shortens a signal link.

Implementation of the present invention is described in detail in the following with reference to specific embodiments.

Embodiment 1

Figure 2:
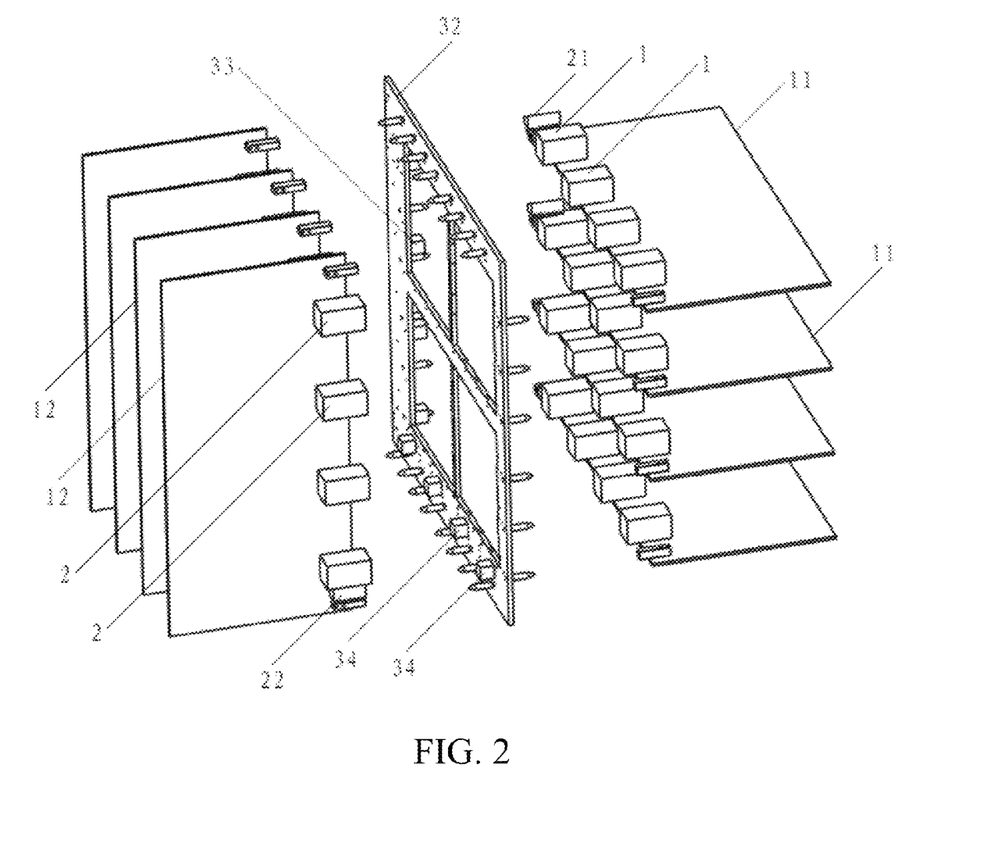
FIG. 2 is a schematic structural diagram of a perpendicular and orthogonal interconnection system according to Embodiment 1 of the present invention (a center backplane has a hollow frame structure)
Figure 3:
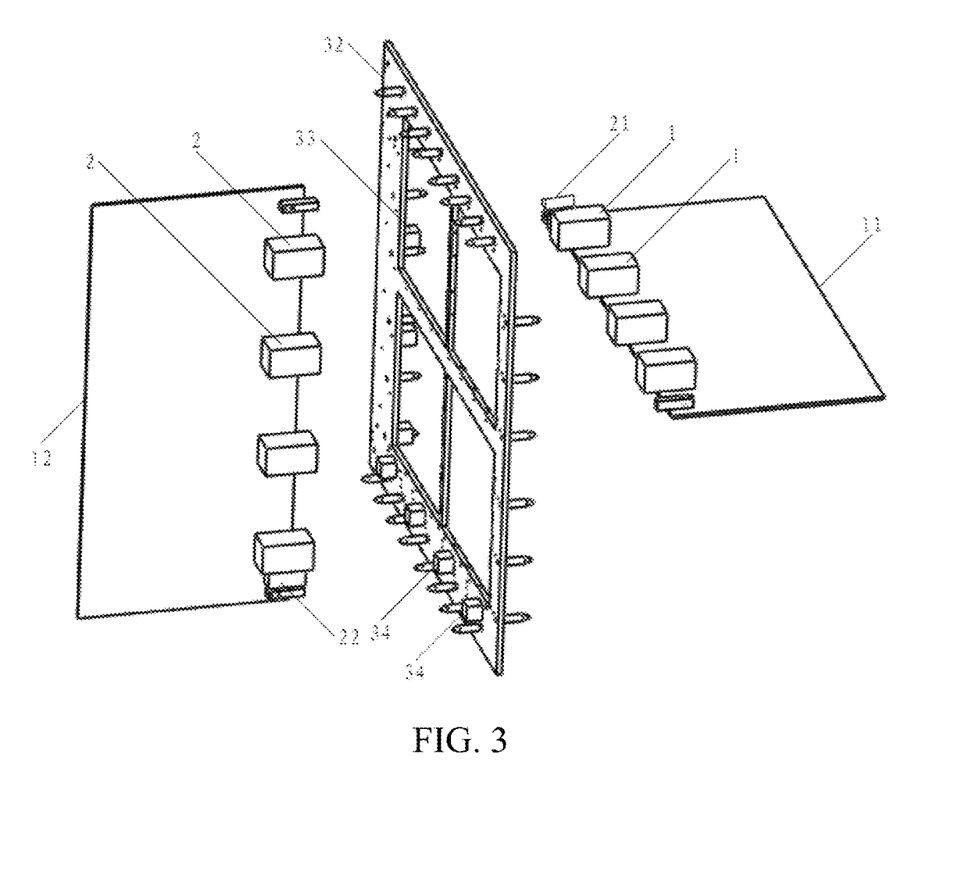

As shown in FIG. 2 and FIG. 3, a perpendicular and orthogonal interconnection system provided by this embodiment of the present invention includes a first board group, a second board group orthogonal to the first board group, and a center backplane 32 arranged between the first board group and the second board group, where the first board group includes a plurality of first boards 11 parallel to each other, and the second board group includes a plurality of second boards 12 parallel to each other; a plurality of curved male connectors 1 is arranged on each of the first boards 11, a plurality of curved female connectors 2 is arranged on each of the second boards 12, the curved male connectors 1 and the curved female connectors 2 directly cooperate and are connected in one-to-one correspondence, and the curved male connectors 1 and the curved female connectors 2 in one-to-one correspondence constitute orthogonal connectors.

When the perpendicular and orthogonal interconnection system is upgraded, only the first board group and the second board group need to be replaced, which is rather simple, shortens a signal link, and is low in upgrade costs. Compared with the prior art, the perpendicular and orthogonal interconnection system does not need an orthogonal backplane and connectors (for example, orthogonal straight male connectors) on two sides of the orthogonal backplane, thereby greatly reducing costs. Because there is no orthogonal backplane, board signals are directly connected, and a link length reaches the minimum.

In addition, because there is no orthogonal backplane in the middle, cooling air can directly enter a rear side board from a front side board, air ducts are truly interconnected, and heat dissipation capability of the system is raised to the maximum, thereby solving the problem of air duct design difficulty caused by perpendicular front and rear air ducts of a system in an existing orthogonal architecture.

In this embodiment of the present invention, the center backplane 32 has a hollow frame structure. The center backplane 32 is in the shape of a square or a rectangle, which is easy for processing and fabrication. a first connector 21 electrically connected to the curved male connectors 1 is arranged on each of the first boards 11, a second connector 22 electrically connected to the curved female connectors 2 is arranged on each of the second boards 12, and third connectors 33 and fourth connectors 34 electrically connected to the first connectors 21 and the second connectors 22 are separately arranged on two perpendicular sides of the center backplane 32. In this design, a power source or a control signal is transmitted to the curved male connectors 1 sequentially through the third connectors 33, the first connectors 21, and the first boards 11, so as to supply power to the curved male connectors 1 and control the curved male connectors 1.

Similarly, in this design, a power source or a control signal is transmitted to the curved female connectors 2 sequentially through the fourth connectors 34, the second connectors 22, and the second boards 12, so as to supply power to the curved female connectors 2 and control the curved female connectors 2. In this way, a transmission path of the power source and the control signal is the shortest, and attenuation is the smallest, which is conducive to power supply and control. In addition, the center backplane 32 enables the first connectors 21 to cooperate with and connect to the third connectors 33, and enables the second connectors 22 to cooperate with and connect to the fourth connectors 34; therefore, a current and a low-speed control signal are transmitted independently, and reliability of the perpendicular and orthogonal interconnection system is improved.

Generally, the perpendicular and orthogonal interconnection system is arranged in a main cabinet with a plurality of guide rails, the guide rails may be arranged longitudinally or transversely, and the first boards 11 and the second boards 12 are orthogonal after being installed along the guide rails of the main cabinet; therefore, installation of the boards is more convenient. The main cabinet is relatively stable, and reliability of the system is improved. The center backplane 32 is set to have the hollow frame structure, which improves stability of installing the center backplane 32 to the main cabinet. Generally, the center backplane 32 is longitudinally arranged in the middle of the main cabinet. One side of the center backplane 32 is the first board group, and the other side of the center backplane 32 is the second board group. The boards in each board group are evenly and reasonably arranged, which is conducive to air duct design and further improves heat dissipation capability of the perpendicular and orthogonal interconnection system.

Embodiment 2

Figure 4:
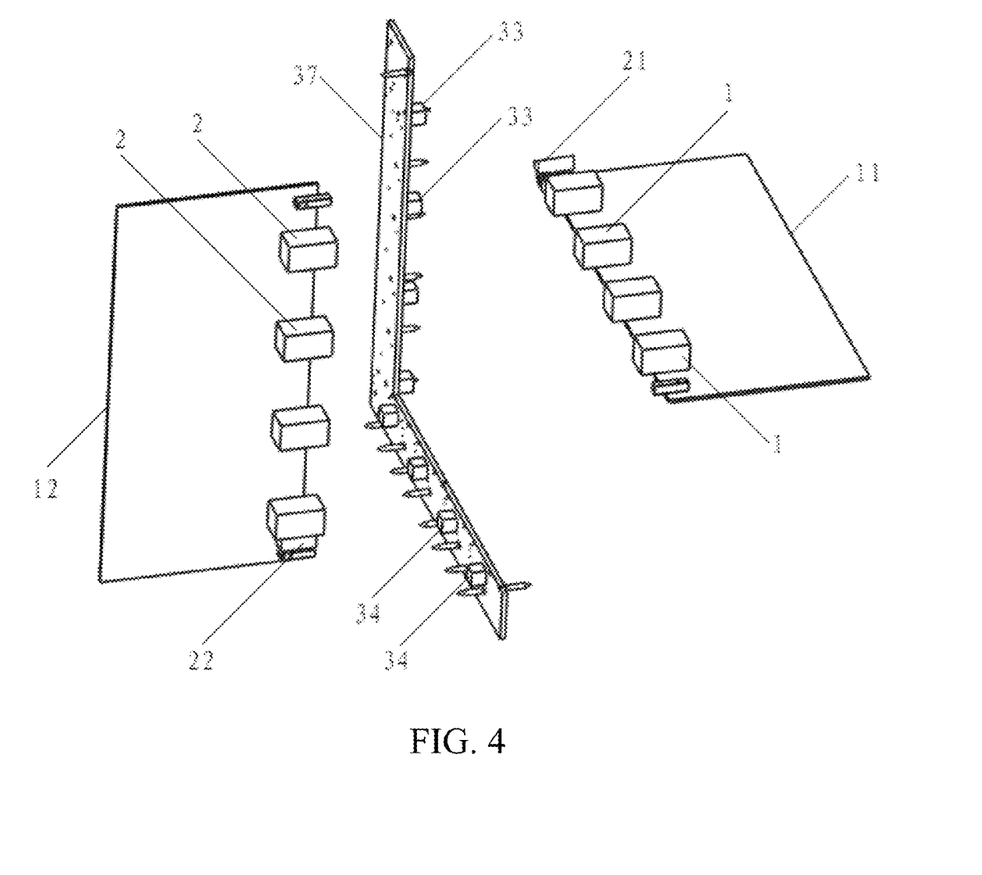
FIG. 4 is a schematic structural diagram of a perpendicular and orthogonal interconnection system according to Embodiment 2 of the present invention (a center backplane is L-shaped)

As shown in FIG. 4, a perpendicular and orthogonal interconnection system provided by this embodiment of the present invention includes a first board group, a second board group orthogonal to the first board group, and a center backplane 37 arranged between the first board group and the second board group, where the first board group includes a plurality of first boards 11 parallel to each other, and the second board group includes a plurality of second boards 12 parallel to each other; a plurality of curved male connectors 1 is arranged on each of the first boards 11, a plurality of curved female connectors 2 is arranged on each of the second boards 12, the curved male connectors 1 and the curved female connectors 2 directly cooperate and are connected in one-to-one correspondence, and the curved male connectors 1 and the curved female connectors 2 in one-to-one correspondence constitute orthogonal connectors.

When the perpendicular and orthogonal interconnection system is upgraded, only the first board group and the second board group need to be replaced, which is rather simple and low in upgrade costs. Compared with the prior art, the perpendicular and orthogonal interconnection system does not need an orthogonal backplane and connectors (for example, orthogonal straight male connectors) on two sides of the orthogonal backplane, thereby greatly reducing costs. Because there is no orthogonal backplane, board signals are directly connected, and a link length reaches the minimum. In addition, because there is no orthogonal backplane in the middle, cooling air can directly enter a rear side board from a front side board, air ducts are truly interconnected, and heat dissipation capability of the system is raised to the maximum, thereby solving the problem of air duct design difficulty caused by perpendicular front and rear air ducts of a system in an existing orthogonal architecture.

In this embodiment of the present invention, the center backplane 37 is L-shaped, which is easy for processing and fabrication and saves materials. a first connector 21 electrically connected to the curved male connectors 1 is arranged on each of the first boards 11, a second connector 22 electrically connected to the curved female connectors 2 is arranged on each of the second boards 12, and third connectors 33 and fourth connectors 34 electrically connected to the first connectors 21 and the second connectors 22 are separately arranged on sides of the center backplane 37. In this design, a power source or a control signal is transmitted to the curved male connectors 1 sequentially through the third connectors 33, the first connectors 21, and the first boards 11, so as to supply power to the curved male connectors 1 and control the curved male connectors 1.

Similarly, in this design, a power source or a control signal is transmitted to the curved female connectors 2 sequentially through the fourth connectors 34, the second connectors 22, and the second boards 12, so as to supply power to the curved female connectors 2 and control the curved female connectors 2. In this way, a transmission path of the power source and the control signal is the shortest, and attenuation is the smallest, which is conducive to power supply and control. In addition, the center backplane 37 enables the first connectors 21 to cooperate with and connect to the third connectors 33, and enables the second connectors 22 to cooperate with and connect to the fourth connectors 34; therefore, a current and a low-speed control signal are transmitted independently, and reliability of the perpendicular and orthogonal interconnection system is improved.

Generally, the perpendicular and orthogonal interconnection system is arranged in a main cabinet with a plurality of longitudinal or transverse guide rails, and the first boards 11 and the second boards 12 are orthogonal after being installed along the guide rails of the main cabinet; therefore, installation of the boards is more convenient. The main cabinet is relatively stable, and reliability of the system is improved. The center backplane 37 is L-shaped, which ensures stability of installing the center backplane 37 to the main cabinet and saves materials. Generally, the center backplane 37 is longitudinally arranged in the middle of the main cabinet. One side of the center backplane 37 is the first board group, and the other side of the center backplane 37 is the second board group. The boards in each board group are evenly and reasonably arranged, which is conducive to air duct design and further improves heat dissipation capability of the perpendicular and orthogonal interconnection system.

Embodiment 3

Figure 5:
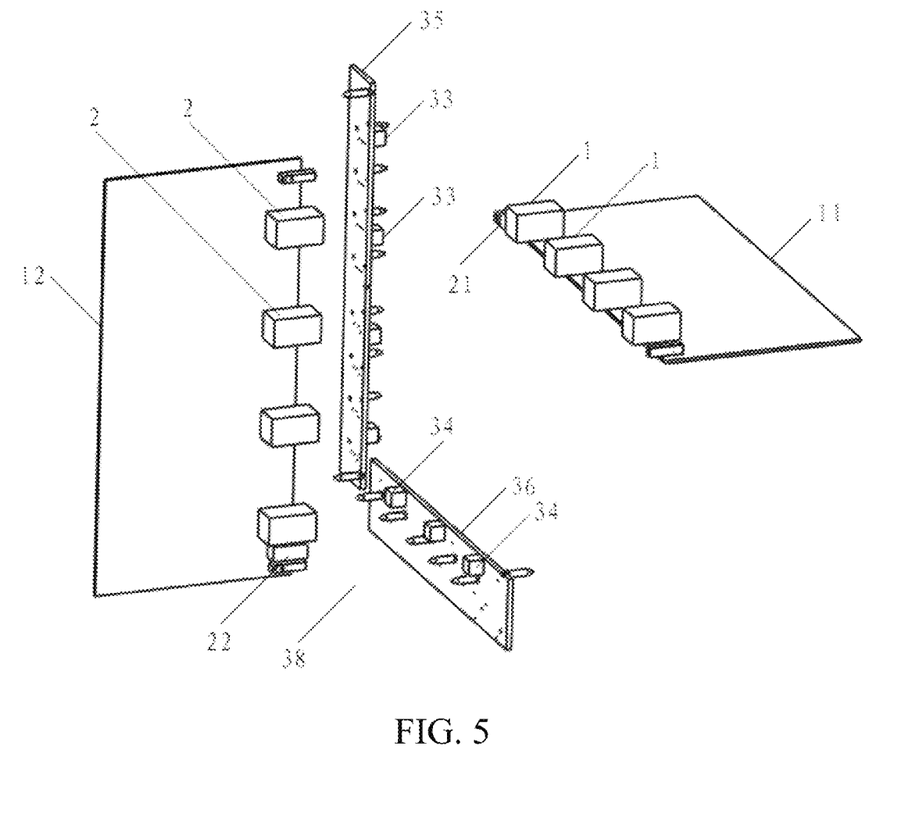
FIG. 5 is a schematic structural diagram of a perpendicular and orthogonal interconnection system according to Embodiment 3 of the present invention (a center backplane is divided into a longitudinal backplane and a transverse backplane).

As shown in FIG. 5, a perpendicular and orthogonal interconnection system provided by this embodiment of the present invention includes a first board group, a second board group orthogonal to the first board group, and a center backplane 38 arranged between the first board group and the second board group, where the first board group includes a plurality of first boards 11 parallel to each other, and the second board group includes a plurality of second boards 12 parallel to each other; a plurality of curved male connectors 1 is arranged on each of the first boards 11, a plurality of curved female connectors 2 is arranged on each of the second boards 12, the curved male connectors 1 and the curved female connectors 2 directly cooperate and are connected in one-to-one correspondence, and the curved male connectors 1 and the curved female connectors 2 in one-to-one correspondence constitute orthogonal connectors. When the perpendicular and orthogonal interconnection system is upgraded, only the first board group and the second board group need to be replaced, which is rather simple, shortens a signal link, and is low in upgrade costs.

Compared with the prior art, the perpendicular and orthogonal interconnection system does not need an orthogonal backplane and connectors (for example, orthogonal straight male connectors) on two sides of the orthogonal backplane, thereby greatly reducing costs. Because there is no orthogonal backplane, board signals are directly connected, and a link length reaches the minimum. In addition, because there is no orthogonal backplane in the middle, cooling air can directly enter a rear side board from a front side board, air ducts are truly interconnected, and heat dissipation capability of the system is raised to the maximum, thereby solving the problem of air duct design difficulty caused by perpendicular front and rear air ducts of a system in an existing orthogonal architecture.

If materials used for making the center backplane 38 are highly rigid, the center backplane 38 may be divided into a plurality of independent backplanes, for example, a longitudinal backplane 35 and a transverse backplane 36. In this way, each independent backplane is easily shaped; besides, materials are saved, resulting in lower costs. a first connector 21 electrically connected to the curved male connectors 1 is arranged on each of the first boards 11, a second connector 22 electrically connected to the curved female connectors 2 is arranged on each of the second boards 12, and third connectors 33 and fourth connectors 34 electrically connected to the first connectors 21 and the second connectors 22 are separately arranged on the longitudinal backplane 35 and the transverse backplane 36. In this design, a power source or a control signal is transmitted to the curved male connectors 1 sequentially through the third connectors 33, the first connectors 21, and the first boards 11, so as to supply power to the curved male connectors 1 and control the curved male connectors 1. Similarly, in this design, a power source or a control signal is transmitted to the curved female connectors 2 sequentially through the fourth connectors 34, the second connectors 22, and the second boards 12, so as to supply power to the curved female connectors 2 and control the curved female connectors 2.

In this way, a transmission path of the power source and the control signal is the shortest, and attenuation is the smallest, which is conducive to power supply and control. In addition, the longitudinal backplane 35 enables the first connectors 21 to cooperate with and connect to the third connectors 33, and the transverse backplane 36 enables the second connectors 22 to cooperate with and connect to the fourth connectors 34; therefore, a current and a low-speed control signal is transmitted independently, and reliability of the perpendicular and orthogonal interconnection system is improved.

Generally, the perpendicular and orthogonal interconnection system is arranged in a main cabinet with a plurality of longitudinal or transverse guide rails, and the first boards 11 and the second boards 12 are orthogonal after being installed along the guide rails of the main cabinet; therefore, installation of the boards is more convenient. The main cabinet is relatively stable, and reliability of the system is improved. The center backplane 38 is divided into the longitudinal backplane 35 and the transverse backplane 36, which ensures stability of installing the center backplane 38 to the main cabinet and saves materials. Generally, the center backplane 38 is longitudinally arranged in the middle of the main cabinet. One side of the center backplane 38 is the first board group, and the other side of the center backplane 38 is the second board group. The boards in each board group are evenly and reasonably arranged, which is conducive to air duct design and further improves heat dissipation capability of the perpendicular and orthogonal interconnection system.

Based on the advantages described in the embodiments, the perpendicular and orthogonal interconnection system is applicable to various communications devices; therefore, its upgrade is convenient, signal quality is improved, heat dissipation is ideal, and material costs are saved.

The above embodiments are merely preferred embodiments of the present invention, but are not intended to limit the present invention. Thus, any modification, equivalent replacement, and improvement made without departing from the spirit and principle of the present invention shall fall within the protection scope of the present invention.

What is claimed is:

1. An interconnection system, comprising:
a first board group comprising a plurality of first boards, the plurality of first boards being substantially parallel to each other;
a second board group comprising a plurality of second boards, the plurality of second boards being substantially parallel to each other, and the plurality of second boards being substantially orthogonal to the plurality of first boards;
a center backplane arranged between the first board group and the second board group;
a plurality of curved male connectors arranged on each of the plurality of first boards; and
a plurality of curved female connectors arranged on each of the plurality of second boards, wherein the curved male connectors and the curved female connectors directly cooperate and are connected in a one-to-one correspondence;
wherein a first connector is arranged on each of the plurality of first boards, and each first connector is electrically connected to one of the plurality of curved male connectors, wherein a second connector is arranged on each of the plurality of second boards, and each second connector is electrically connected to one of the plurality of curved female connectors, and wherein each third connector is electrically connected to a first connector and each fourth connector is electrically connected to a second connector.

2. The interconnection system according to claim 1, wherein the interconnection system comprises a perpendicular and orthogonal interconnection system.

3. The interconnection system according to claim 1, wherein the center backplane has a hollow frame structure.

4. The system according to claim 3, wherein the third connectors and the fourth connectors are separately arranged on two perpendicular sides of the center backplane.

5. The system according to claim 1, wherein the center backplane is L-shaped.

6. The system according to claim 5, wherein the third connectors and the fourth connectors are separately arranged on sides of the center backplane.

7. The system according to claim 1, wherein the center backplane comprises a plurality of independent backplanes.

8. The system according to claim 7, wherein the center backplane comprises a longitudinal backplane and a transverse backplane.

9. The system according to claim 8, wherein the third connectors and the fourth connectors are separately arranged on the longitudinal backplane and the transverse backplane.

10. The system according to claim 1, wherein the interconnection system is arranged in a main cabinet with a plurality of guide rails, and the first boards and the second boards are orthogonal after being installed along the guide rails of the main cabinet.

11. A communications device, wherein the communications device uses the interconnection system according to claim 1.

12. A method, comprising:
providing a first board group comprising a plurality of first boards, the plurality of first boards being substantially parallel to each other;
providing a second board group comprising a plurality of second boards, the plurality of second boards being substantially parallel to each other, and the plurality of second boards being substantially orthogonal to the plurality of first boards;

arranging a center backplane between the first board group and the second board group;

arranging a plurality of curved male connectors arranged on each of the plurality of first boards;

arranging a plurality of curved female connectors arranged on each of the plurality of second boards, wherein the curved male connectors and the curved female connectors directly cooperate and are connected in a one-to-one correspondence;

arranging a first connector on each of the plurality of first boards, wherein each first connector is electrically connected to one of the plurality of curved male connectors;

arranging a second connector on each of the plurality of second boards, wherein each second connector is electrically connected to one of the plurality of curved female connectors; and separately arranging third connectors and fourth connectors on the center backplane, wherein each third connector is electrically connected to a first connector and each fourth connector is electrically connected to a second connector.

13. The method according to claim 12, wherein the center backplane has a hollow frame structure.

14. The method according to claim 12, wherein the third connectors and the fourth connectors are separately arranged on two perpendicular sides of the center backplane.

\* \* \* \* \*